(12) United States Patent
Wang et al.

(10) Patent No.: US 12,340,980 B2
(45) Date of Patent: Jun. 24, 2025

(54) PLASMA SHOWERHEAD WITH IMPROVED UNIFORMITY

(71) Applicant: Applied Materials, Inc., Santa Clara, CA (US)

(72) Inventors: Chaowei Wang, San Diego, CA (US); Kenneth Brian Doering, San Jose, CA (US); Hanhong Chen, Milpitas, CA (US); Kartik Shah, Saratoga, CA (US); Kevin Griffin, Livermore, CA (US); Hao Zhang, Newark, CA (US)

(73) Assignee: Applied Materials, Inc., Santa Clara, CA (US)

( * ) Notice: Subject to any disclaimer, the term of this patent is extended or adjusted under 35 U.S.C. 154(b) by 660 days.

(21) Appl. No.: 17/712,046

(22) Filed: Apr. 1, 2022

(65) Prior Publication Data
US 2023/0317416 A1  Oct. 5, 2023

(51) Int. Cl.
*H01J 37/32*  (2006.01)

(52) U.S. Cl.
CPC ....... *H01J 37/3244* (2013.01); *H01J 37/3222* (2013.01)

(58) Field of Classification Search
CPC .......... H01J 37/3244; H01J 37/3222
See application file for complete search history.

(56) References Cited

U.S. PATENT DOCUMENTS

| | | | |
|---|---|---|---|
| 9,677,176 B2 | 6/2017 | Chandrasekharan et al. | |
| 10,378,107 B2 | 8/2019 | Chandrasekharan et al. | |
| 11,049,694 B2 | 6/2021 | Aubuchon et al. | |
| 11,583,816 B2 | 2/2023 | Lee et al. | |
| 2005/0109460 A1* | 5/2005 | DeDontney | C23C 16/45565 156/345.33 |
| 2006/0021574 A1* | 2/2006 | Armour | C23C 16/45574 427/248.1 |
| 2013/0264014 A1* | 10/2013 | Iizuka | H05H 1/46 156/345.48 |
| 2013/0341433 A1 | 12/2013 | Roy et al. | |
| 2016/0343595 A1 | 11/2016 | Lind et al. | |
| 2018/0294143 A1 | 10/2018 | Chua et al. | |
| 2019/0145002 A1 | 5/2019 | Um et al. | |
| 2019/0221403 A1 | 7/2019 | Myung et al. | |
| 2020/0194233 A1 | 6/2020 | Kao et al. | |
| 2020/0276785 A1 | 9/2020 | Parkhe et al. | |
| 2021/0098231 A1 | 4/2021 | Carducci et al. | |
| 2021/0183621 A1 | 6/2021 | Nguyen et al. | |
| 2022/0157569 A1 | 5/2022 | Moore et al. | |
| 2023/0193463 A1 | 6/2023 | H B et al. | |

(Continued)

FOREIGN PATENT DOCUMENTS

| | | |
|---|---|---|
| KR | 101670804 B1 | 10/2016 |
| WO | 2019032468 A1 | 2/2019 |
| WO | 2021010952 A1 | 1/2021 |

OTHER PUBLICATIONS

PCT International Search Report and Written Opinion in PCT/US2023/017078 dated Aug. 9, 2023, 9 pages.

*Primary Examiner* — Yuechuan Yu
(74) *Attorney, Agent, or Firm* — Servilla Whitney LLC

(57) ABSTRACT

Plasma showerheads with improved gas uniformity, and a plasma showerhead with angled gas nozzles are disclosed. Also disclosed are gas nozzles having a vertical offset angle and/or a directional offset angle. None of the gas channels and/or the gas nozzles intersect with the plasma regions of the showerhead.

20 Claims, 5 Drawing Sheets

(56) References Cited

U.S. PATENT DOCUMENTS

| | | |
|---|---|---|
| 2023/0294116 A1 | 9/2023 | Iyengar et al. |
| 2023/0386829 A1 | 11/2023 | Asrani et al. |
| 2025/0037978 A1 | 1/2025 | Baluja et al. |

* cited by examiner

PLASMA SHOWERHEAD WITH IMPROVED UNIFORMITY

TECHNICAL FIELD

Embodiments of the disclosure generally relate to plasma showerheads with improved gas uniformity. In particular, embodiment of the disclosure pertain to plasma showerheads for high-frequency emission sources which utilize angled gas nozzles to improve gas uniformity.

BACKGROUND

Inside a plasma station, a plasma resonator may limit the available configurations for gas channels and nozzles. Accordingly, there is a need for a gas distribution system which provides process gasses without interfering with plasma resonators.

Further, vertical nozzles (also referred to as straight nozzles) often demonstrate high gas flow nonuniformity at the wafer surface. This nonuniformity can create localized drops in wafer temperature under the nozzle openings. The drop in temperature can cause a reduction in deposited film thickness and lead to increased nonuniformity across the wafer and potential device failure.

Accordingly, there is a need for a showerhead which provides increased gas flow uniformity across a wafer without interfering with plasma resonators.

SUMMARY

One or more embodiments of the disclosure are directed to a plasma showerhead comprising a plurality of plasma regions, a plurality of gas channels embedded within the showerhead and extending parallel to a bottom surface of the showerhead, and a plurality of gas nozzles extending from each gas channel to a corresponding plurality of holes in the bottom surface. Each plasma region is spaced apart from every adjacent plasma region.

Additional embodiments of the disclosure are directed to a plasma showerhead comprising a plurality of plasma regions, a plurality of gas channels embedded within the showerhead extending from near a peripheral edge towards the center of the showerhead, and a plurality of gas nozzles extending from each gas channel to a corresponding plurality of holes in the bottom surface. Each plasma region is configured to accept a plasma applicator. The gas channels and the gas nozzles do not intersect with any of the plurality of plasma regions. One or more of the plurality of gas nozzles has a vertical offset angle and a directional offset angle.

BRIEF DESCRIPTION OF THE DRAWINGS

So that the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
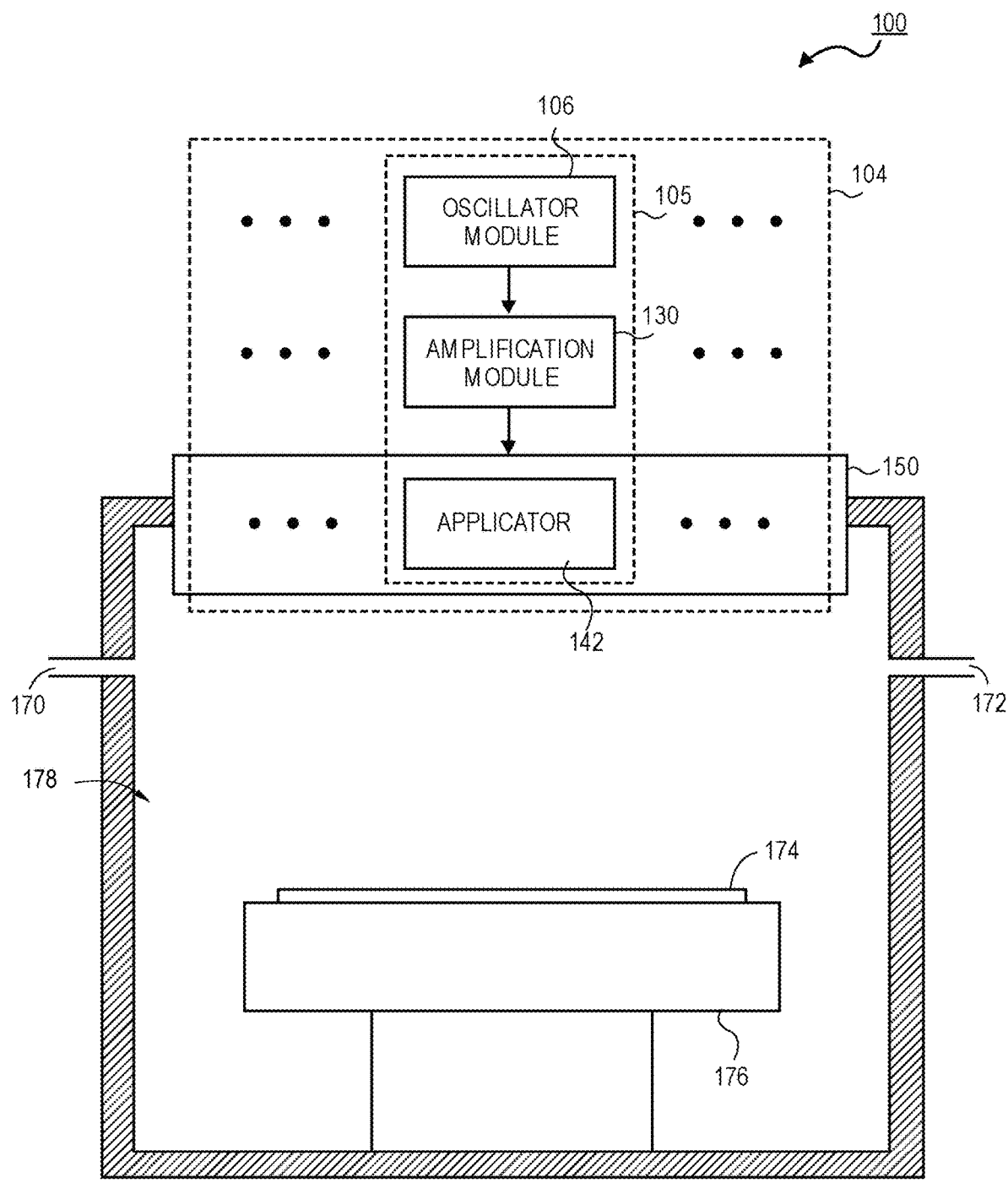
FIG. 1 illustrates a schematic diagram of a plasma processing tool that includes a high-frequency emission source according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" or "wafer" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate/wafer can mean both a bare substrate and/or a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates.

In general, devices in accordance with some embodiments described herein provide adaptation for a modular high-frequency emission source that is used in conjunction with an applicator frame (e.g., showerhead) that includes an integrated gas distribution system. In the following description, numerous specific details are set forth to provide a thorough understanding of embodiments. It will be apparent to one skilled in the art that embodiments may be practiced without these specific details. In other instances, well-known aspects are not described in detail to not unnecessarily obscure embodiments. Furthermore, it is to be understood that the various embodiments shown in the accompanying drawings are illustrative representations and are not necessarily drawn to scale.

Some embodiments include a modular high-frequency emission source that comprises an array of high-frequency emission modules. According to an embodiment, each high-frequency emission module comprises an oscillator module, an amplification module, and an applicator. In some embodiments, the applicator couples the high-frequency radiation into a processing tool to generate a radiation field and/or a plasma. The use of a plurality of high-frequency emission modules allows for the applicators to be arranged in different configurations to match the needs of a processing tool. In some embodiments, the applicators may be positioned in openings that pass through an applicator frame. In some embodiments, the applicator frame may have regions clear of other elements to facilitate placement of the applicators.

As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz. According to some embodiments, each high-frequency emission module comprises an oscillator module, an amplification module, and an applicator. In some embodiments, the oscillator module and the amplification module comprise electrical components that are all solid state electronic components.

Proper distribution of gases in a processing chamber is needed in processing chambers. Typically, gases are provided into an upper portion of the chamber and distributed through a gas distribution plate. The gas distribution plates include channels for flowing and distributing the gasses over a desired area. The fine channels require precise manufacturing, which can result in relatively high costs. Accordingly, embodiments described herein integrate a gas distribution system into a showerhead configured to accept and couple the applicators to the processing chamber. Furthermore, integrating the gas distribution system into the applicator frame allows for some embodiments to omit a dedicated gas distribution system typically needed for processing tools.

The use of an array of high-frequency emission modules provides a number of benefits over traditional systems (e.g., magnetrons) including a significant reduction in the size and the complexity of a high-frequency radiation source. Further, the use of an array of high-frequency emission modules provides greater flexibility in the ability to locally change the radiation field and/or the plasma density by independently changing the power settings of the amplification module for each high-frequency emission module. Additionally, the use of individual high-frequency emission modules provides a greater power density than is currently available in existing radiation sources and/or plasma sources.

Some embodiments include an array of high-frequency emission modules with each high-frequency emission module having its own oscillator module. When a plurality of oscillator modules is used, the electromagnetic radiation generated by a first oscillator module may not interfere with the electromagnetic radiation generated by a second oscillator module because the first and second oscillator modules may not be at the same frequency nor have a controlled phase difference between the first and second oscillator modules. Accordingly, in embodiments where a plasma is formed, the plasma will have improved uniformity since there is no interference pattern.

Referring now to FIG. 1, a cross-sectional illustration of a plasma processing tool 100 is shown, according to one or more embodiments. In some embodiments, the processing tool 100 may be a processing tool suitable for any type of processing operation that utilizes a plasma. For example, the processing tool 100 may be a processing tool used for plasma enhanced chemical vapor deposition (PECVD), plasma enhanced atomic layer deposition (PEALD), etch and selective removal processes, and/or plasma cleaning.

Generally, the illustrated embodiment includes a processing tool 100 that includes a chamber 178. The chamber 178 may be a vacuum chamber which includes a pump (not shown) for removing gases from the chamber to provide the desired vacuum. Some embodiments may include a chamber 178 that includes one or more gas lines 170 for providing processing gasses into the chamber 178 and exhaust lines 172 for removing byproducts from the chamber 178. In some embodiments, chamber 178 may be a pressure vessel, maintaining a pressure equal to or greater than one atmosphere of pressure. While not shown, it is to be appreciated that the processing tool 100 may include a gas distribution plate for evenly distributing the processing gases over a substrate 174. In some embodiments, the processing tool 100 may optionally not include a chamber, (i.e., the processing tool 100 may be a chamberless processing tool).

In some embodiments, the substrate 174 may be supported on a pedestal 176. For example, the pedestal 176 may be a chuck, such as an electrostatic chuck. The pedestal may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to one or more embodiment, the processing tool 100 includes a modular high-frequency emission source 104. The modular high-frequency emission source 104 may comprise an array of individual high-frequency emission modules 105. In some embodiments, each high-frequency emission module 105 may include an oscillator module 106, an amplification module 130, and an applicator 142. In some embodiments, the oscillator module 106 and the amplification module 130 may comprise electrical components that are solid state electrical components. In some embodiments, each of the plurality of oscillator modules 106 may be communicatively coupled to a different amplification module 130. In some embodiments, there may be a 1:1 ratio between oscillator modules 106 and amplification modules 130. For example, each oscillator module 106 may be electrically coupled to a single amplification module 130. In some embodiments, the plurality of oscillator modules 106 may generate electromagnetic radiation that is at more than one frequency, and that does not have a controlled phase relationship. Accordingly, the electromagnetic radiation induced in the chamber 178 will not interact in a manner that results in an undesirable interference pattern.

In some embodiments, each oscillator module 106 generates electromagnetic radiation that is transmitted to the amplification module 130. After processing by the amplification module 130, the electromagnetic radiation is transmitted to the applicator 142. According to some embodiments, an array of applicators 142 are coupled to the chamber 178 are positioned over, in, or through an applicator frame 150. For this disclosure, the applicator frame 150 may also be referred to as a plasma showerhead. In some embodiments, the applicators 142 each function as an antenna for emitting the electromagnetic radiation into the chamber 178. In some embodiments, the applicators 142 couple the electromagnetic radiation to the processing gasses in the chamber 178 to produce a plasma.

Figure 2:
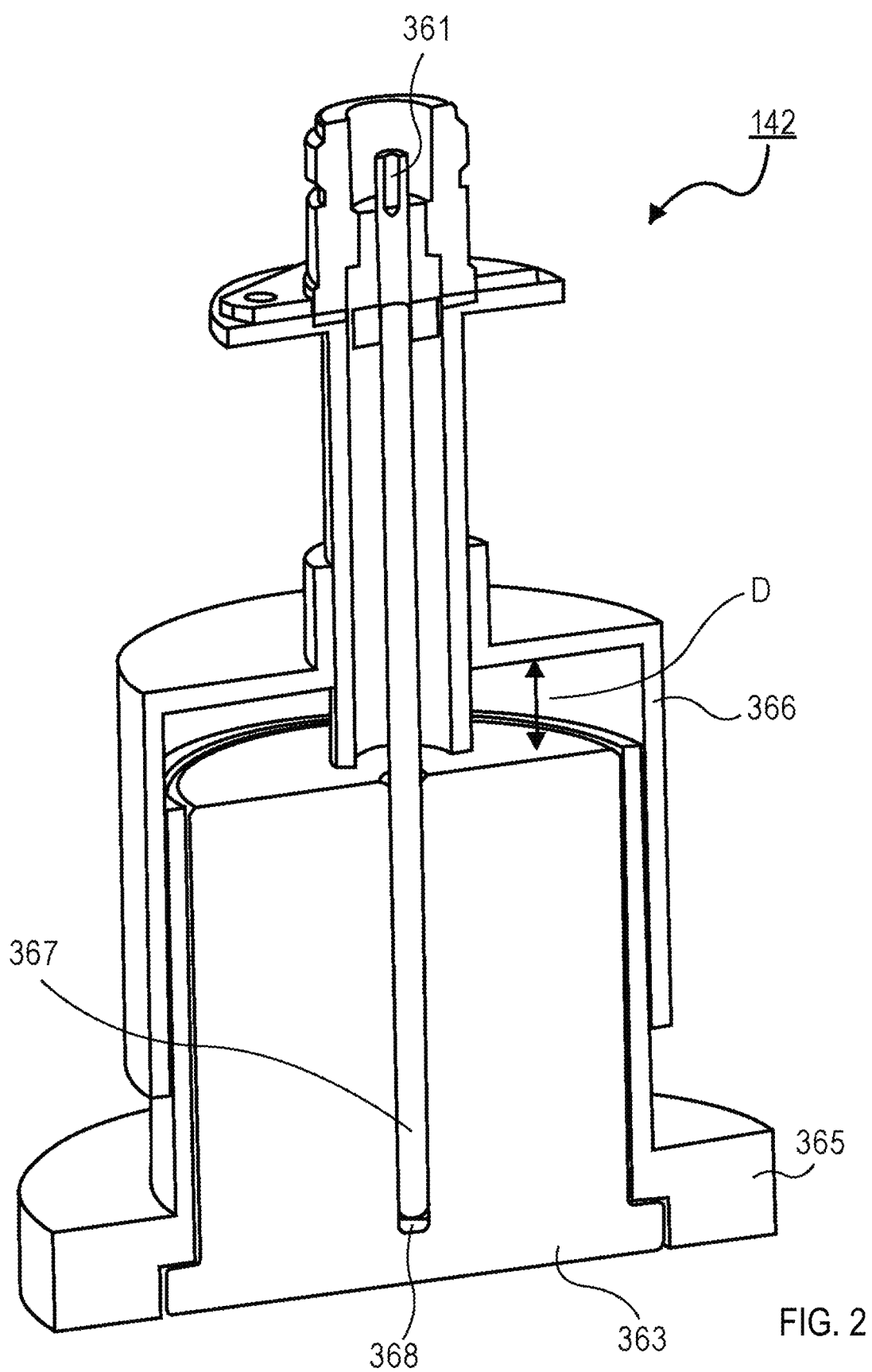
FIG. 2 illustrates a cross-sectional view of an applicator that may be used to couple high-frequency radiation to a processing chamber according to one or more embodiments of the disclosure.

Referring now to FIG. 2, a cut-away illustration of an applicator 142 is shown, according to an embodiment. In some embodiments, the electromagnetic radiation is transmitted to an applicator 142 by a coaxial cable 361 that couples to a monopole 367 that extends axially through the applicator 142. In an embodiment where the electromagnetic radiation is high-frequency radiation, the monopole 367 may also extend into a channel 368 formed into a center of a dielectric resonant cavity 363. The dielectric resonant cavity 363 may be a dielectric material, such as quartz, aluminum oxide, titanium oxide, or the like. Additional embodiments may also include a resonant cavity 363 that does not include a material (i.e., the dielectric resonant cavity 363 may be air or a vacuum). According to an embodiment, the dielectric resonator is dimensioned so that the dielectric resonator supports resonance of the high-frequency radiation. Generally, the size of the dielectric resonant cavity 363 is dependent on the dielectric constant of the material used to form the dielectric resonant cavity 363 and the frequency of the high-frequency radiation. For example, materials with higher dielectric constants would allow for smaller resonant cavities 363 to be formed. In an embodiment where the dielectric resonant cavity 363 includes a circular cross-section, the diameter of the dielectric resonant cavity 363 may be between approximately 1 cm and 15 cm. In some embodiments, the cross-section of the dielectric resonant cavity 363 along a plane perpendicular to the monopole 367 may be any shape, so long as the dielectric resonant cavity 363 is dimensioned to support resonance. In the illustrated embodiment, the cross-section along a plane perpendicular to the monopole 367 is circular, though other shapes may also be used, such as polygons (e.g., triangles, rectangles, etc.), symmetrical polygons (e.g., squares, pentagons, hexagons, etc.), ellipses, or the like).

In some embodiments, the cross-section of the dielectric resonant cavity 363 may not be the same at all planes perpendicular to the monopole 367. For example, the cross-section of a bottom extension proximate to the open end of the applicator housing 365 is wider than the cross-section of the dielectric resonant cavity proximate to the channel 368. In addition to having cross-sections of different dimensions, the dielectric resonant cavity 363 may have cross-sections with different shapes. For example, the portion of the dielectric resonant cavity 363 proximate to the channel 368 may have a circular shaped cross-section, whereas the portion of the dielectric resonant cavity 363 proximate to the open end of the applicator housing 365 may be a symmetrical polygon shape (e.g., pentagon, hexagon, etc.). However, it is to be appreciated that embodiments may also include a dielectric resonant cavity 363 that has a uniform cross-section at all planes perpendicular to the monopole 367.

According to some embodiments, the applicator 142 may also include an impedance tuning backshort 366. The backshort 366 may be a displaceable enclosure that slides over an outer surface of the applicator housing 365. When adjustments to the impedance need to be made, an actuator (not shown) may slide the backshort 366 along the outer surface of the applicator housing 365 to change a distance D between a surface of the backshort 366 and a top surface of the dielectric resonant cavity 363. As such, some embodiments provide more than one way to adjust the impedance in the system. According to some embodiments, an impedance tuning backshort 366 may be used in conjunction with a feedback process to account for impedance mismatches. Alternatively, the feedback process or an impedance tuning backshort 356 may be used by themselves to adjust for impedance mismatches.

According to some embodiment, the applicator 142 functions as a dielectric antenna that directly couples the high-frequency electromagnetic field into the processing chamber 178. The particular axial arrangement of the monopole 367 entering the dielectric resonant cavity 363 may produce an TM010 mode excitation. However different modes of excitation may be possible with different applicator arrangements. For example, while an axial arrangement is illustrated in FIG. 2, it is to be appreciated that the monopole 367 may enter the dielectric resonant cavity 363 from other orientations. In one such embodiment, the monopole 367 may enter the dielectric resonant cavity 363 laterally, (i.e., through a sidewall of the dielectric resonant cavity 363).

It is to be appreciated that the applicator 142 illustrated in FIG. 2 is exemplary in nature, and embodiments of this disclosure are not limited to the design or mode of operation described herein. For example, the applicator 142 in FIG. 2 is particularly suitable for emitting microwave radiation. However, embodiments may include any applicator design that is configured to emit any high-frequency electromagnetic radiation.

Some embodiments of this disclosure provide plasma showerheads, also referred to as applicator frames including gas distribution. In some embodiments, the plasma showerheads comprise at least a face plate and a facility plate. The face plate is proximate to the bottom surface of the showerhead, while the facility plate abuts the opposite side of the face plate from bottom surface. The facility plate typically comprises gas channels and connections to gas inputs, while the face plate typically comprises gas nozzles which transport process gases from the gas channels to the bottom surface of the showerhead.

Some embodiments of this disclosure advantageously provide angled gas nozzles to improve one or more of the uniformity of process gas distribution, the uniformity of process gas flow at the substrate surface, wafer temperature uniformity during processing, or deposited film thickness. Some embodiments of this disclosure advantageously provide gas nozzles of varying diameter for similar effects.

Figure 3:
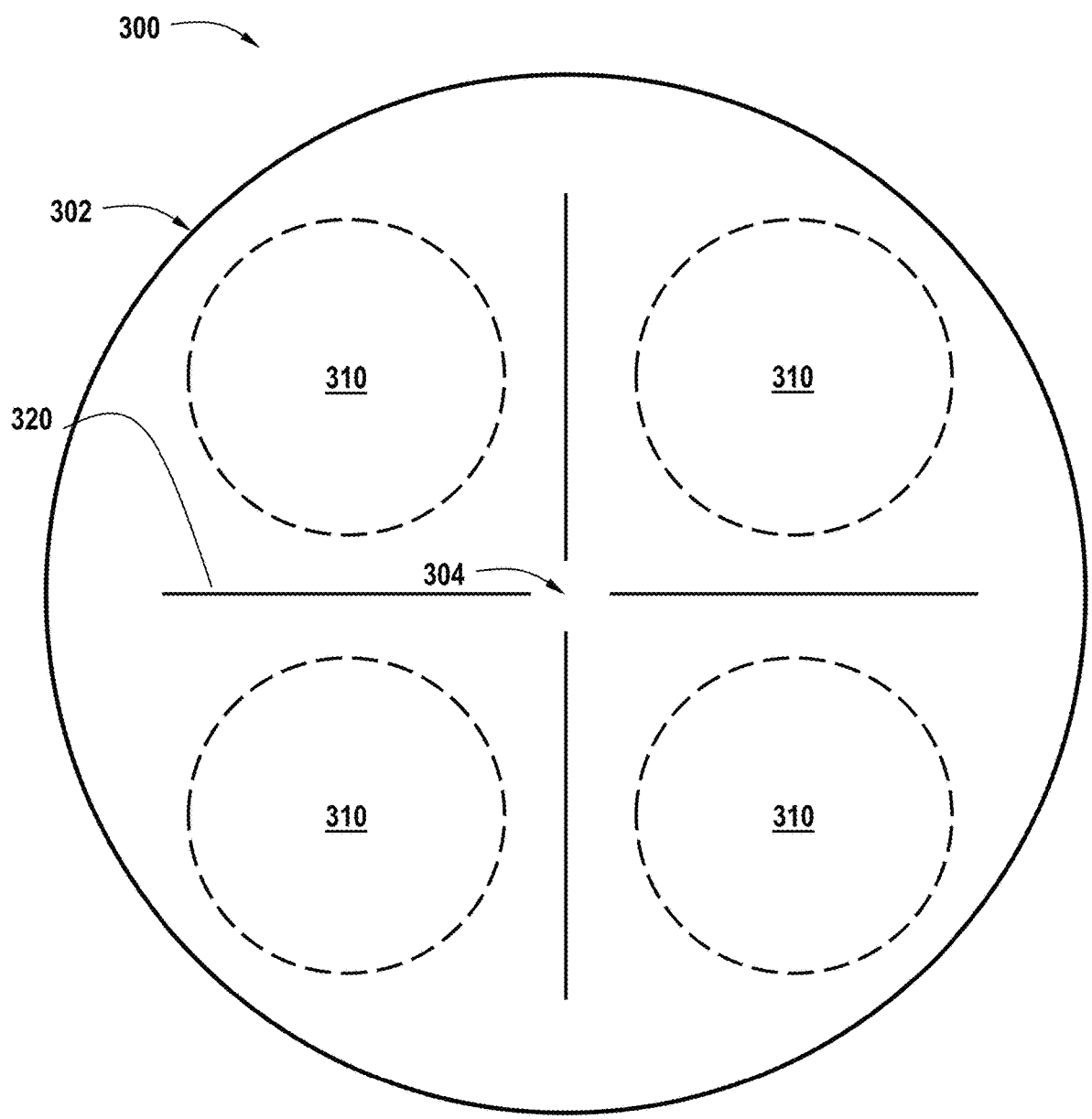
FIG. 3 illustrates a schematic diagram of a plurality of gas channels and a plurality of plasma regions according to one or more embodiments of the disclosure.

FIG. 3 illustrates a cross-sectional view of a facility plate for a plasma showerhead according to one or more embodiments of this disclosure. The plasma showerhead 300 comprises a plurality of plasma regions 310. While shown in FIG. 3 as circular regions, the plasma regions may take any suitable shape or size. The plasma regions 310 run vertically through the facility plate and the face plate.

In some embodiments, the showerhead 300 is configured to accept at least one plasma applicator 142 within each plasma region 310. Without limitation, being "configured to accept" an applicator may include having a modified material composition in the plasma region 310, having a modified thickness (including through holes) in the plasma region 310, or spatially arranging other elements of the showerhead 300 (e.g., gas channels, gas nozzles) such that they do not encroach or overlap the plasma region 310. In some embodiments, none of the gas channels 320 (described further below) intersect with any of the plasma regions 310. In some embodiments, none of the gas nozzles 510 (described further below) intersect with any of the plasma regions 310.

Figure 4:
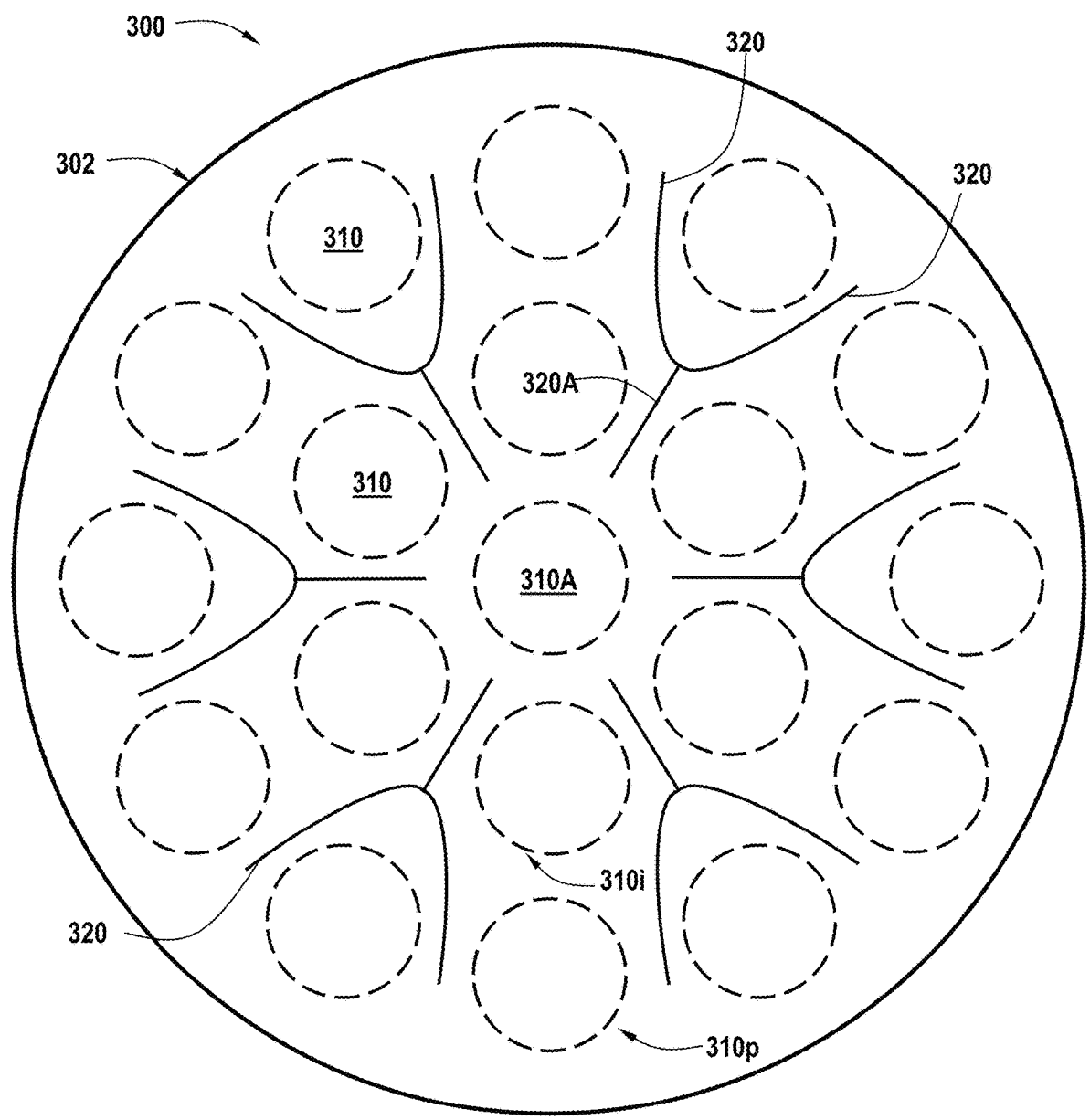
FIG. 4 illustrates an alternative arrangement of a plurality of gas channels and a plurality of plasma regions according to one or more embodiments of the disclosure.

In some embodiments, as shown in FIG. 3, the plasma regions are arranged in a single ring. In some embodiments, as shown in FIG. 4, the plurality of plasma regions 310 are arranged in concentric rings including an outer concentric ring 310*p* and an inner concentric ring 310*i*. In some embodiments, as shown in FIG. 3, the showerhead 300 does not have a plasma region 310 at the center of the showerhead. In some embodiments, as shown in FIG. 4, the showerhead 300 includes a central plasma region 310A overlapping or centered on the center of the showerhead 300.

In some embodiments, the plurality of plasma regions 310 form a triangular pattern, square pattern (as shown in FIG. 3), or hexagonal pattern (as shown in FIG. 4). In some embodiments, each plasma region is spaced apart from every adjacent plasma region. While any number of plasma regions may be present, in some embodiments, there are greater than or equal to 18 plasma regions.

Referring again to FIG. 3, the showerhead 300 also comprises a plurality of gas channels 320. The gas channels may be described as being embedded within the showerhead 300 as the face plate is found below the facility plate where the gas channels 320 are located. The gas channels 300 extend substantially parallel to the bottom surface of the showerhead. In some embodiments, the plurality of gas channels 320 are arranged in a single plane.

In some embodiments, each of the plurality of gas channels 320 extends from near a peripheral edge 302 of the showerhead 300 toward the center 304 of the showerhead 300. In some embodiments, the gas channels 320 connect to a gas inlet (not shown) near the peripheral edge 302 of the showerhead 300.

In some embodiments, as shown in FIG. 4, at least two gas channels 320, as they extend towards the center 304 of the showerhead 300, merge to form a merged channel 320A, the at least two gas channels 320 are disposed between adjacent plasma regions 310 of the outer concentric ring 310p and the merged channel 320A is disposed between adjacent plasma regions 310 of the inner concentric ring 310i. In some embodiments, not shown, a single gas channel 320 may branch to form two or more gas channels as it extends towards the center 304 of the showerhead 300. In some embodiments, the plurality of gas channels 320 may branch and merge repeatedly to form a pattern akin to chicken wire.

Figure 5:
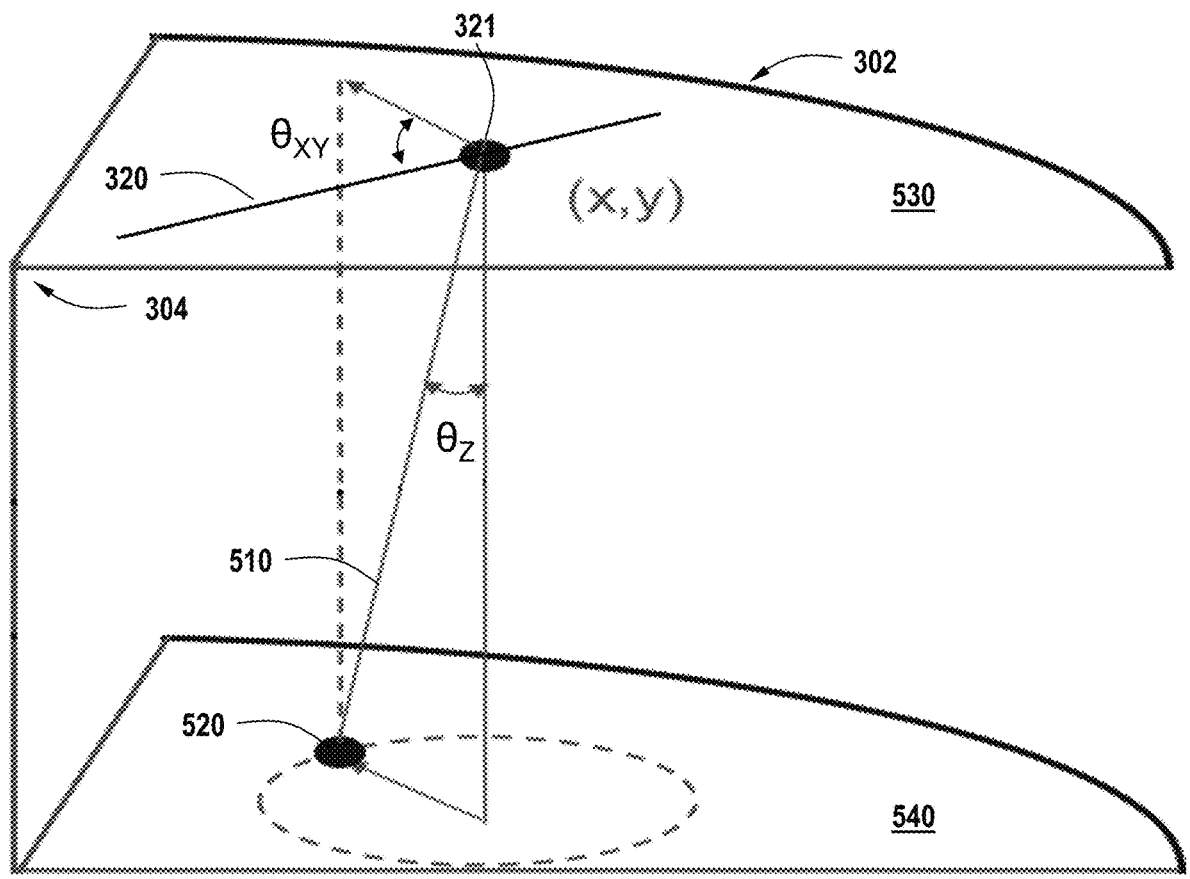
FIG. 5 illustrates a perspective view of a gas nozzle with a vertical offset angle and a directional offset angle according to one or more embodiments of the disclosure.

Referring to FIG. 5, some embodiments of the plasma showerhead 300 comprise a plurality of gas nozzles 510. A plurality of gas nozzles 510 extend from each gas channel 320 to a corresponding plurality of holes 520 in the bottom surface 540 of the showerhead 300. For the avoidance of doubt, FIG. 5 shows two parallel planes. The first plane 530 corresponds to the facility plate comprising the gas channels 320. The second plane 540 corresponds to the bottom surface of the showerhead 300. The region between the planes corresponds to the face plate comprising the gas nozzles 510.

In some embodiments, one or more of the plurality of gas nozzles 510 is vertical. In some embodiments, one or more of the plurality of gas nozzles 510 is angled from vertical and referred to as an angled gas nozzle. As used in this regard, "vertical" corresponds to the line which intersects both planes at a right angle.

As shown in FIG. 5, the angle from vertical of the illustrated gas nozzle is shown as $\theta_Z$. This angle is also referred to as a vertical offset angle. In some embodiments, the angled gas nozzle has a vertical offset angle of up to 55°. In some embodiments, the vertical offset angle is in a range of 15° to 50°, or in a range of 30° to 45°. In some embodiments, the vertical offset angle is 30° or 45°.

In some embodiments, one or more angled gas nozzles 510 are also angled from the direction of an intersected gas channel 320 at an intersection point 321. As used in this regard, the "direction" of a gas channel is away from the peripheral edge 302 of the showerhead 300. As shown in FIG. 5, the angle from the direction of the intersected gas channel 320 for the illustrated gas nozzle 510 is shown as $\theta_{XY}$. This angle is also referred to as a directional offset angle.

In some embodiments (not shown), more than one gas nozzle 510 intersects a gas channel 320 at the same intersection point 321. In some embodiments, at least one of the intersecting gas nozzles has a different vertical offset angle. In some embodiments, at least one of the intersecting gas nozzles has a different directional offset angle. In some embodiments, two gas nozzles intersect and have the same vertical offset angle and opposing directional offset angles. As used in this regard, "opposing directional offset angles" are separated by 180°.

In some embodiments, the arrangement of the plasma regions, the gas channels and the gas nozzles is radially symmetrical. As shown in FIGS. 3 and 4, a "radially symmetrical" arrangement means that each element is reflected across the central axis of the showerhead. In some embodiments, as shown in FIG. 4, the plasma showerhead 300 comprises six identical, radially symmetrical segments or wedges.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A plasma showerhead comprising:
    a plurality of plasma regions, each plasma region spaced apart from every adjacent plasma region;
    a plurality of gas channels in a first plane embedded within the plasma showerhead and extending parallel to a bottom surface of the plasma showerhead in a second plane parallel to the first plane; and
    a plurality of gas nozzles extending from each gas channel in the first plane to a corresponding plurality of holes in the bottom surface in the second plane, wherein one or more of the plurality of gas nozzles is an angled gas nozzle which is angled from a vertical extending between the first plane and the second plane.

2. The plasma showerhead of claim 1, wherein the plasma showerhead is configured to accept at least one plasma applicator within each plasma region.

3. The plasma showerhead of claim 1, wherein the plurality of plasma regions are arranged in concentric rings.

4. The plasma showerhead of claim 1, wherein the plurality of plasma regions are arranged in a hexagonal pattern.

5. The plasma showerhead of claim 1, wherein there are greater than or equal to 18 plasma regions.

6. The plasma showerhead of claim 1, wherein each of the plurality of gas channels extends in the first plane from near a peripheral edge of the plasma showerhead toward the center of the plasma showerhead.

7. The plasma showerhead of claim 6, wherein at least two of the plurality of gas channels merge to form a merged channel.

8. The plasma showerhead of claim 1, wherein none of the gas channels intersect with any of the plasma regions.

9. The plasma showerhead of claim 1, wherein the plurality of plasma regions are arranged in concentric rings including an outer concentric ring and an inner concentric ring and at least two gas channels are disposed between adjacent plasma regions of the outer concentric ring and the two gas channels extend to provide a merged channel extending between adjacent plasma regions of the inner concentric ring.

10. The plasma showerhead of claim 1, wherein more than half of the plurality of gas nozzles are angled gas nozzles angled from the vertical.

11. The plasma showerhead of claim 1, wherein the angled gas nozzle has a vertical offset angle of up to 55° from the vertical.

12. The plasma showerhead of claim 11, wherein the angled gas nozzle having the vertical offset angle up to 55° from the vertical also has a directional offset angle in the first plane with respect to one of the plurality of gas channels that intersects with the angled gas nozzle.

13. The plasma showerhead of claim 12, wherein more than one of the plurality of gas nozzles intersects the one of the plurality of gas channels that intersects with the angled gas nozzle, the more than one of plurality of intersecting gas nozzles having an intersection point that is the same.

14. The plasma showerhead of claim 13, wherein at least one of the plurality of intersecting gas nozzles has a different vertical offset angle from another one of the plurality of intersecting gas nozzles.

15. The plasma showerhead of claim 13, wherein at least one of the plurality of intersecting gas nozzles has a different directional offset angle from another one of the plurality of intersecting gas nozzles.

16. The plasma showerhead of claim 13, wherein two gas nozzles intersect, and the intersecting gas nozzles have a vertical offset angle that is the same and opposing directional offset angles.

17. The plasma showerhead of claim 1, wherein none of the gas nozzles intersect with any of the plasma regions.

18. The plasma showerhead of claim 1, wherein the plasma regions, the gas channels and the gas nozzles are arranged in a radially symmetrical pattern.

19. The plasma showerhead of claim 18, wherein the plasma showerhead comprises six identical, radially symmetrical segments.

20. A plasma showerhead comprising:
a plurality of plasma regions, each plasma region configured to accept a plasma applicator, the plasma regions including;
a plurality of gas channels in a first plane and embedded within the plasma showerhead extending from near a peripheral edge towards the center of the plasma showerhead, wherein the gas channels do not intersect with any of the plurality of plasma regions; and
a plurality of gas nozzles extending from each gas channel to a corresponding plurality of holes in a bottom surface of the plasma showerhead in a second plane parallel to the first plane, the plurality of plasma regions are arranged in concentric rings including an outer concentric ring and an inner concentric ring and at least two gas channels are disposed between adjacent plasma regions of the outer concentric ring and the two gas channels extend to provide a merged channel extending between adjacent plasma regions of the inner concentric ring, the plurality of gas channels and gas nozzles do not intersect with any of the plurality of plasma regions.

* * * * *

UNITED STATES PATENT AND TRADEMARK OFFICE
CERTIFICATE OF CORRECTION

| | | |
|---|---|---|
| PATENT NO. | : 12,340,980 B2 | Page 1 of 1 |
| APPLICATION NO. | : 17/712046 | |
| DATED | : June 24, 2025 | |
| INVENTOR(S) | : Chaowei Wang et al. | |

It is certified that error appears in the above-identified patent and that said Letters Patent is hereby corrected as shown below:

In the Specification

Column 6, Line 3, replace "TM010" before "mode excitation" with "TM01δ".

Signed and Sealed this
Twenty-sixth Day of August, 2025

Coke Morgan Stewart
*Acting Director of the United States Patent and Trademark Office*